(12) United States Patent
Andoh

(10) Patent No.: US 9,352,381 B2
(45) Date of Patent: May 31, 2016

(54) LEAD PIN RECTIFYING APPARATUS AND LEAD PIN RECTIFYING METHOD

(75) Inventor: Fumikata Andoh, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 860 days.

(21) Appl. No.: 13/586,539

(22) Filed: Aug. 15, 2012

(65) Prior Publication Data

US 2013/0042663 A1 Feb. 21, 2013

(30) Foreign Application Priority Data

Aug. 17, 2011 (JP) ................................. 2011-178345

(51) Int. Cl.
| | | |
|---|---|---|
| B21F 1/00 | (2006.01) | |
| H05K 13/02 | (2006.01) | |
| H05K 13/00 | (2006.01) | |
| H01S 5/022 | (2006.01) | |

(52) U.S. Cl.
CPC ............ *B21F 1/004* (2013.01); *H05K 13/0092* (2013.01); *H05K 13/023* (2013.01); *H01S 5/02212* (2013.01)

(58) Field of Classification Search
CPC ............. B21F 1/004; B21F 1/00; B21D 5/01; B21C 37/04; B21C 37/045; H05K 13/023; H05K 13/0092
USPC .................................... 72/386; 140/105, 106
See application file for complete search history.

(56) References Cited

U.S. PATENT DOCUMENTS

| | | | | | |
|---|---|---|---|---|---|
| 3,447,575 | A | * | 6/1969 | Johanson | 72/391.2 |
| 3,515,175 | A | * | 6/1970 | Hudson | 140/105 |
| 4,553,420 | A | * | 11/1985 | Fierkens et al. | 72/380 |
| 4,711,015 | A | * | 12/1987 | Tega et al. | 140/105 |
| 5,832,963 | A | * | 11/1998 | Hornisch | 140/105 |

FOREIGN PATENT DOCUMENTS

| | | |
|---|---|---|
| JP | S57-173342 | 4/1980 |
| JP | H2-123330 | 10/1990 |
| JP | 9-181396 | 7/1997 |
| JP | 10-107378 | 4/1998 |
| JP | H10-326854 | 12/1998 |
| JP | 2003-154428 | 5/2003 |

* cited by examiner

*Primary Examiner* — Alexander P Taousakis
*Assistant Examiner* — Mohammad I Yusuf
(74) *Attorney, Agent, or Firm* — Cooper & Dunham LLP

(57) ABSTRACT

A lead pin rectifying apparatus is provided, including a first member which includes a tapered upper face and a cylindrically-shaped side face; a cylindrically-shaped second member which has an inner diameter corresponding to an outer diameter of the first member, wherein the second member covers over the first member therewith while an electronic component having the lead pin is housed inside the second member; and a pressing member which presses the electronic component to the first member from the top side of the second member while housing the electronic component having the lead pin inside the second member to abut the lead pin against an upper face of the first member, wherein the second member is pressed to the first member after pressing the electronic component to the first member with the pressing member to rectify the shape of the lead pin of the electronic component.

10 Claims, 5 Drawing Sheets

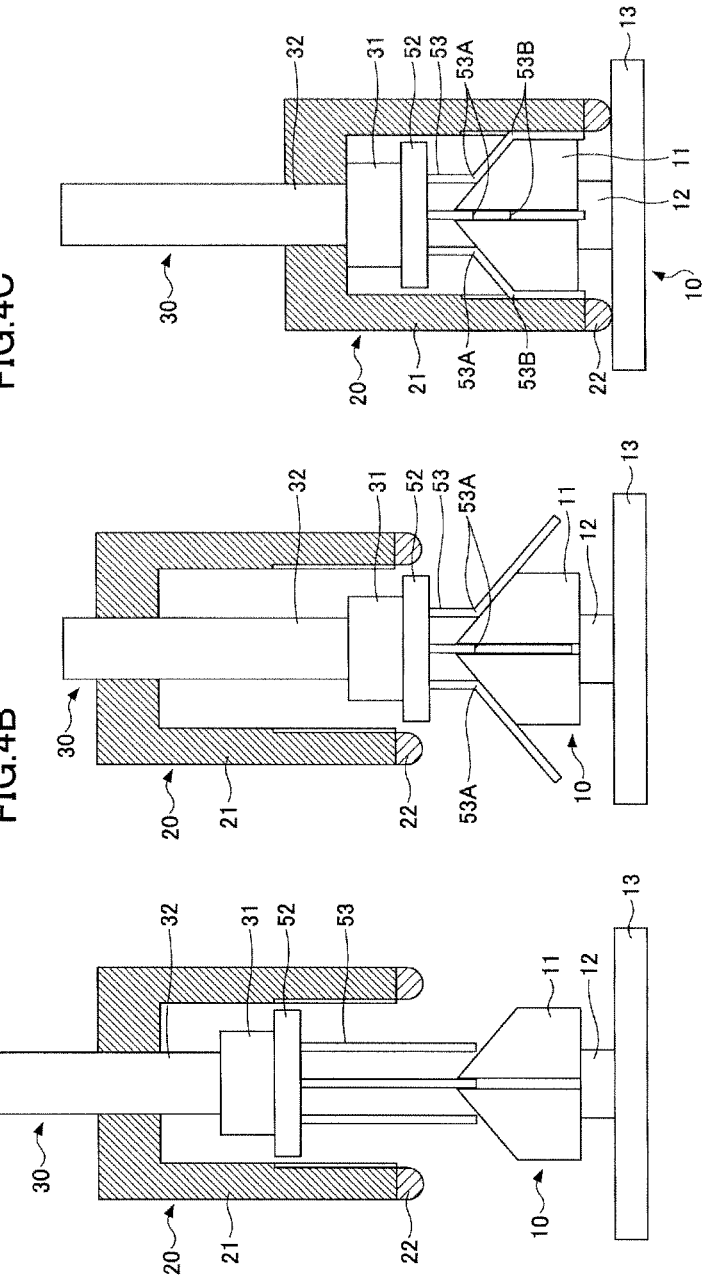

LEAD PIN RECTIFYING APPARATUS AND LEAD PIN RECTIFYING METHOD

TECHNICAL FIELD

The present invention relates to lead pin rectifying apparatuses and lead pin rectifying methods.

BACKGROUND ART

In conjunction with a trend towards multi-beam laser diodes in semiconductor laser apparatuses, the semiconductor laser apparatuses now include multiple lead pins. Moreover, there is a trend towards high density of mounting onto a printed circuit board. Therefore, there arises a need to provide, within a narrow region of the printed circuit board, multiple lead holes for inserting the lead pins.

The lead pins are inserted into the lead holes provided at the printed circuit board to be fastened by soldering. The lead holes are arranged on generally the same circumference in a plane view.

However, as a pitch (a distance) between neighboring lead holes is narrow and a diameter of a circle formed by multiple lead holes is small, there may occur a failure such as a solder bridge and an increase in assembly time due to a decrease in operational efficiency when the lead pins are soldered to the print circuit board.

In order to deal with such problems, there are techniques to rectify the shape of the lead pins to increase an interval between lead pins (see Patent documents 1 and 2, for example).

When the interval between the lead pins is increased, an interval between the lead holes also increases in correspondence with the lead pins, so that the occurrence of the solder bridge and the decrease in the operational efficiency are suppressed.

However, in a method in Patent document 1, when a positioning member and a laser holder which holds the semiconductor laser apparatus are synthetic resin, a wall portion of a straight hole is scraped with a tip portion of the lead pin when the semiconductor laser apparatus presses into a mirror cylinder. Therefore, fine particles, fragments, etc., are produced, and, with the produced fine particles and fragments, positioning accuracy of the semiconductor laser decreases and problems of deterioration of optical characteristics and pollution of other optical components may Occur.

Moreover, a lead pin may get caught in the wall portion of the straight hole, so that bending of the lead pin may occur, unnecessary work and time may arise due to altering, disposing, etc., possibly leading to an increased cost.

Moreover, in Patent document 2, after a step of spreading a lead pin with a wedge-shaped opening forming member is performed, a step of positioning the lead pin at a bending starting position is performed, and then a step of moving a bending tool from the bending starting position to the bending ending position on the side of the lead pin is performed. In other words, in Patent document 2, the lead pins are rectified by the three steps and are rectified one by one.

Therefore, in Patent document 2, there is a problem of increasing manufacturing cost.

Moreover, in the method of rectifying the lead pin in Patent document 2, excessive stress may be exerted at a root of the lead pin when rectifying the shape of the lead pin, so that the lead pin may be damaged.

As described above, there is a problem that the lead pin is not efficiently rectified with related art methods of rectifying the lead pin.

PATENT DOCUMENTS

Patent document 1 JP9-181396A
Patent document 2 JP2003-154428A

DISCLOSURE OF THE INVENTION

Thus, an object of the present invention is to provide a lead pin rectifying method and a lead pin rectifying apparatus which may efficiently rectify a lead pin.

According to an embodiment of the present invention, a lead pin rectifying apparatus is provided, including, a first member which includes a tapered upper face and a cylindrically-shaped side face which continues from the upper face; a cylindrically-shaped second member which has an inner diameter corresponding to an outer diameter of the first member, wherein the second member covers over the first member therewith while an electronic component having the lead pin is housed inside the second member; and a pressing member which presses the electronic component to the first member from the top side of the second member while housing the electronic component having the lead pin inside the second member to abut the lead pin against an upper face of the first member, wherein the second member is pressed to the first member after pressing the electronic component to the first member with the pressing member to rectify the shape of the lead pin of the electronic component.

A lead pin rectifying apparatus and a lead pin rectifying method according to the present embodiments make it possible to efficiently rectify a lead pin.

BRIEF DESCRIPTION OF THE DRAWINGS

Other objects, features, and advantages of the present invention will become more apparent from the following detailed descriptions when read in conjunction with the accompanying drawings, in which:

FIGS. 4A, 4B, and 4C are diagrams showing, in steps, a method of rectifying a shape of a lead pin 53 of a semiconductor laser apparatus 50 according to a lead pin rectifying apparatus 100 of the embodiment.

BEST MODE FOR CARRYING OUT THE INVENTION

Below embodiments to which a lead pin rectifying apparatus and a lead pin rectifying method of the present invention are applied are described.

Figure 1:
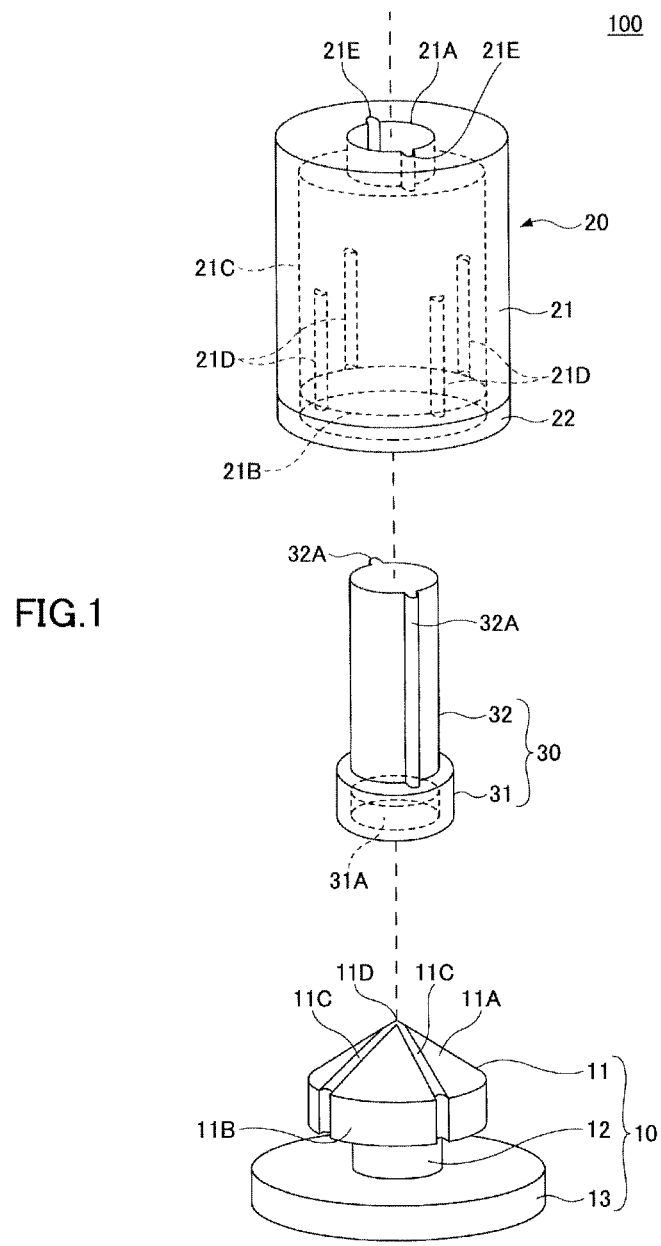
FIG. 1 is an exploded perspective view showing a lead pin rectifying apparatus according to an embodiment.
Figure 2A:
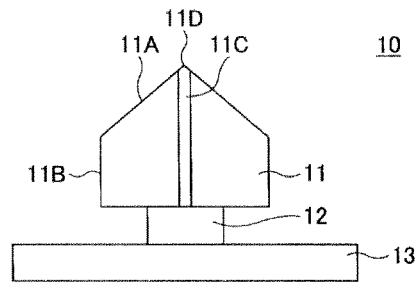
FIGS. 2A, 2B, and 2C are diagrams showing a cross-sectional structure of the lead pin rectifying apparatus according to the embodiment.
Figure 2B:
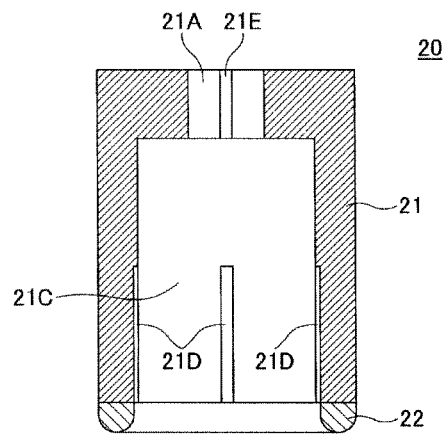
Figure 2C:
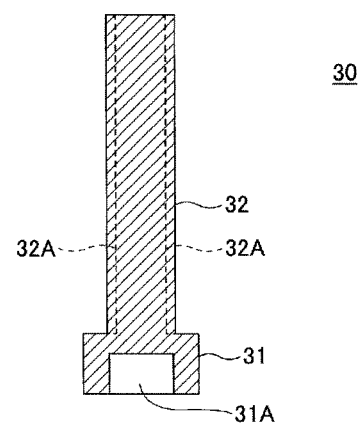

FIG. 1 is an exploded perspective view showing a lead pin rectifying apparatus according to an embodiment. FIGS. 2A, 2B, and 2C are diagrams showing a cross-sectional structure of the lead pin rectifying apparatus according to the embodiment.

A lead pin rectifying apparatus 100 of the embodiment includes a lower side rectifying portion 10, an upper side rectifying portion 20, and a pressing member 30. Cross sections shown in FIGS. 2A to 2C are respectively a cross section which passes through a central axis of the lower side rectifying portion 10, the upper side rectifying portion 20, and the pressing member 30.

The lower side rectifying portion 10, which is an example of a first member, includes a head portion 11, an intermediary portion 12, and a base portion 13. The head portion 11 includes a tapered upper face 11A, and a cylindrically-shaped side face 11B which continues from the upper face 11A. The head portion 11 has a shape which is axially symmetrical with respect to a central axis. A shape of the upper face 11A may also be called a "cone shape".

Four grooves 11C are formed on the upper face 11A and the side face 11B of the head portion 11. The four grooves 11C, which is an example of a first guiding groove, are arranged such that they radially spread at 90 degree intervals in a plane view from a top portion 11D of the head portion 11.

The lower rectifying portion 10 which is used at the time of rectifying the lead pin of the semiconductor laser apparatus, while the head portion 11 is a portion which abuts against the lead pin to perform rectifying. Therefore, the shape of the upper face 11A, the side face 11B, and the groove 11C of the head portion 11 corresponds to the shape of the rectified lead pin.

The lead pin rectifying apparatus 100 of the embodiment includes four grooves 11C so as to align with a semiconductor laser apparatus which includes four lead pins.

A tip of the lead pin after the shape is rectified by the four grooves 11C is located on the same circumference. A diameter of a circle matches a diameter of a circumferential belt shaped side face 11B. Here, the diameter of the circle is called a "land circle diameter". The land circle diameter is a diameter of a circle at which a tip of a rectified lead pin 53 is located.

The intermediary portion 12 is a portion which connects the head portion 11 and the base portion 13 and holds the head portion 11 against the base portion 13. The intermediary portion 12 has a cylindrical shape.

The base portion 13, which is a disc-shaped member, holds the head portion 11 via the intermediary portion 12. The base portion 13 is a portion being a base for the lower side rectifying portion 10.

Such a lower side rectifying portion 10 is formed by coating silicone resin on the surface after integrally forming the head portion 11, the intermediary portion 12, and the base portion 13 with a stainless steel (SUS), for example.

The upper side rectifying portion 20, which is an example of the second member, is a cylindrically-shaped member which is cored. The upper side rectifying portion 20 includes a cylindrical body 21 and an O-ring 22.

The cylindrical body 21 includes an opening 21A at the top and an opening 21B at the bottom. An opening diameter of the opening 21B is equal to an inner diameter of an inner wall portion 21C. An opening diameter of the opening 21A is smaller than an inner diameter of the inner wall portion 21C.

In other words, the cylindrical body 21, which forms a through hole at a bottom face of a cup-shaped member, has a shape such that it is placed upside down. The through hole which is formed at the bottom face of the cup-shaped member corresponds to the opening 21A.

The inner diameter of the inner wall portion 21C of the cylindrical body 21 corresponds to an outer diameter of the head portion 11 of the lower side rectifying portion 10. This is to rectify a shape of the lead pin of the semiconductor laser apparatus by having the head portion 11 inserted along the inner wall portion 21C from the opening 21B side.

Thus, the inner diameter of the inner wall portion 21C of the cylindrical body 21 is set to be somewhat larger than the outer diameter of the head portion 11. For example, when the outer diameter of the head portion 11 is 10 mm, the inner diameter of the inner wall portion 21C of the cylindrical body 21 is set to 10.5 mm.

Four grooves 21D are formed at the inner wall portion 21C of the cylindrical body 21. The groove 21D, which is an example of a second guiding groove, is formed in parallel to a central axis of the cylindrical body 21, abuts against the opening 21B, and has a predetermined length from the opening 21B.

The four groves 21D are formed in 90 degree intervals in the plane view. This is to make it correspond to the four grooves 11C formed at the head portion 11 of the lower side rectifying portion 10.

The upper side rectifying portion 20 is positioned relative to the lower side rectifying portion 10. Thus, when the head portion 11 is inserted into an inner space of the cylindrical body 21 along the it wall portion 21C of the cylindrical body 21, a portion positioned at the side face 11B out of the groove 11C of the head portion 11 opposes the groove 21D. Four lead pins of the semiconductor laser apparatus are positioned between the groove 21D and the portion positioned at the side face 11B out of the groove 11C.

Moreover, two grooves 21E are formed at the opening 21A of the cylindrical body 21. The two grooves 21E are formed in 180 degree intervals in the plane view, for example. The groove 21E is formed from the upper end to the lower end of the opening 21A. The groove 21E is formed in order to position the pressing member 30.

The cylindrical body 21 of such an upper side rectifying portion 20 is formed by forming a cup-shaped member with a stainless steel (SUS), forming a through hole at a bottom portion of the cup-shaped member and then coating silicone resin on the surface.

Moreover, at a lower end of the cylindrical body 21 is mounted an o-ring 22. The o-ring 22, which is an example of an elastic member, has an outer diameter equal to the cylindrical body 21. The inner diameter of the o-ring 22 is set to a value which is larger than the inner diameter of the inner wall portion 21C by a depth of the groove 21D. In other words, in the plane view, the o-ring 22 does not overlap with the four grooves 21D.

The o-ring 22 is formed of urethane rubber, for example. The o-ring 22 is joined to the lower end of the cylindrical body 21.

The pressing member 30 has a holding portion 31 and a stay 32. The holding portion 31 has a concave portion 31A which is hollowed out from the bottom face side. The opening diameter and the depth of the concave portion 31A of the holding portion 31 correspond to the size of the laser portion of the semiconductor laser apparatus.

The stay 32, which is connected to the upper side of the holding portion 31, is inserted into the opening 21A of the upper side rectifying portion 20. Thus, the stay 32 has an outer diameter which corresponds to the opening 21A of the upper side rectifying portion 20.

Moreover, the stay 32 has two convex portions 32A. The convex portion 32A, which is fixed from the lower end to the upper end of the stay 32, is formed at 180 degree intervals the plane view.

The convex portion 32A is formed in order to position the pressing member 30 relative to the upper side rectifying portion 20 by being abutted against the groove 21E when the stay 32 is inserted into the opening 21A of the upper side rectifying portion 20.

Such a pressing portion 30 is formed by coating silicone resin on the surface after integrally forming the holding portion 31 and the stay 32 with stainless steel (SUS), for example.

Figure 3A:
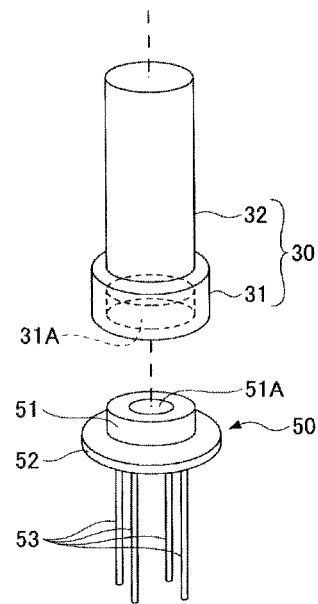
FIGS. 3A and 3B are diagrams showing how a semiconductor laser apparatus is held with a pressing member of the lead pin rectifying apparatus according to the embodiment.
Figure 3B:
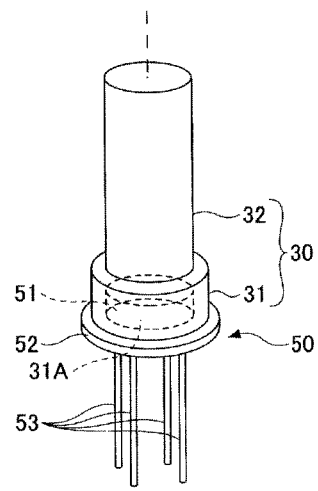

FIGS. 3A and 3B are diagrams showing how a semiconductor laser apparatus is held with a pressing member of the lead pin rectifying apparatus according to the embodiment.

As shown in FIG. 3A, the semiconductor laser apparatus 50 is positioned on the lower side of the pressing member 30. The semiconductor laser apparatus 50 includes a laser portion 51, a stem portion 52, and four lead pins 53.

The laser portion 51, which has two semiconductor laser chips embedded therein, emits laser light from a light-emitting hole 51A. The semiconductor laser chip is mounted to the stem portion 52. A portion at which the semiconductor laser chip is sealed with a cover is the laser portion 51.

The stem portion 52, which has a heat sink, etc., has the laser portion 51 mounted. The stem portion 52 may be made of metal or resin, for example.

The lead pins 53, which are made of copper, for example, are connected to the two semiconductor laser chips via the stem portion 52. Of the four lead pins 53, one is a lead pin for power supply and another is a lead pin for ground. The remaining two are lead pins for voltage inputs for driving the two laser chips.

The pressing member 30 holds the semiconductor laser apparatus 50 by absorbing the laser portion 51 of the semiconductor laser apparatus 50 within the concave portion 31A, for example. Therefore, the pressing member 30 has an absorbing tube (not shown) for holding the semiconductor laser apparatus while absorbing the semiconductor laser apparatus formed from an upper portion of the concave portion 31A to an upper portion of the stay 32.

Here, while an embodiment is explained of the pressing member 30 holding the semiconductor laser apparatus 50 by absorbing the semiconductor laser apparatus 50, the configuration therefor is not limited thereto as long as it may hold the semiconductor laser apparatus 50, so that various well-known means may be used.

As shown in FIG. 3B, the semiconductor laser apparatus 50 is held by the pressing member 30.

In the lead pin rectifying apparatus 100 according to the embodiment, the lower side rectifying portion 10 is provided on a base (not shown), for example. The upper side rectifying portion 20 is made possible to move up and down with a driving apparatus, for example, while the pressing member 30 is inserted through the through hole 21A from the lower side. Moreover, the pressing member 30 is made possible to move up and down with the driving apparatus independent of the upper side rectifying portion 20.

When the upper side rectifying portion 20, which is positioned relative to the lower side rectifying portion 10, is moved downward relative to the upper side rectifying portion 20, the groove 21D, and a portion positioned at the side face 11B out of the groove 11C of the head portion 11. Here, the inner wall portion 21C of the cylindrical body 21 is moved down while opposing the side face 11B of the head portion 11.

Next, a method of rectifying a shape of the lead pin 53 of the semiconductor laser apparatus 50 is described.

FIGS. 4A to 4C are diagrams showing, in steps, a method of rectifying a shape of the lead pin 53 of the semiconductor laser apparatus 50 according to the lead pin rectifying apparatus 100 of the embodiment.

FIGS. 4A to 4C show a lead pin on the nearer side and a lead pin on the farther side out of the four lead pins 53 being overlapped in a lateral view. Thus, FIGS. 4A to 4C show three lead pins 53 located on the nearer side, and on the left and on the right.

First, the semiconductor laser apparatus 50 is held by the pressing member 30.

Next, as shown in FIG. 4A, the pressing member 30 is moved down to a position at which the lead pin 53 abuts against the upper face 11A of the head portion 11 of the lower side rectifying portion 10. Here, the tip of the lead pin 53 is abutted against the groove 11C of the head portion 11. Moreover, the lower side rectifying portion 10 is then covered over with the upper side rectifying portion 20.

Then, as shown in FIG. 4B, when the pressing member 30 is moved down further, the lead pin 53 is pressed by the groove 11C, so that the tip side of the lead pin is spread radially to the outside along the upper face 11A of the head portion 11.

Then, the lead pin 53 bends along a cone shape (or a tapered shape) of the upper face 11A of the head portion 11, and the bent portion gradually moves from the tip of the lead pin 53 to the root side.

Then, as shown in FIG. 4B, when the bent portion 53A of the lead pin 53 arrives at a desired position, the pressing portion 30 is fixed at that position, and, as shown in FIG. 4C, the upper side rectifying portion 20 is moved down to the upper face of the base portion 13 of the lower side rectifying portion 10.

In this way, the lead pin 53 is bent at a border of the side face 11B and the upper face 11A of the head portion 11, so that the bent portion 53B is formed. Here, the tip side of the bent portion 53B of the lead pin 53 is guided downward such that it is placed between the groove 21D of the upper side rectifying portion 20 and a portion located at the side face 11B out of the groove 11C of the head portion 11.

Now, rectifying of the shape of the lead pin 53 according to the lead pin rectifying apparatus 100 of the embodiment is completed.

A position at which the pressing member 30 is pushed into the upper side rectifying portion 20, a length of the upper side rectifying portion 20 in a central axis direction, a length of the groove 21D, etc., may be set according to dimensions of each portion of the semiconductor laser apparatus 50.

Moreover, the position at which the pressing member 30 is pushed into the upper side rectifying portion 20 may be detected with a sensor, etc., for example.

Figure 5A:
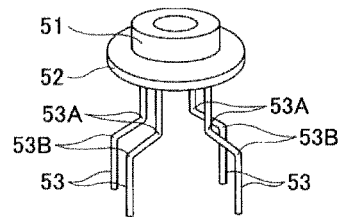
FIGS. 5A and 5B are diagrams showing the semiconductor laser apparatus after the rectifying of the shape of the lead pin 53 is completed.
Figure 5B:
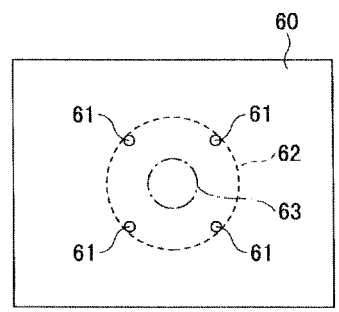

The semiconductor laser apparatus 50 after having completed the rectifying is as shown in FIGS. 5A and 5B.

FIGS. 5A and 5B are diagrams showing the semiconductor laser apparatus 50 after the rectifying of the shape of the lead pin 53 is completed.

As shown in FIG. 5A, the lead pin 53 of the semiconductor laser apparatus 50 is bent at the bent portions 53A and 53B.

In this way, the tip of the four lead pins 53 after it has the shape rectified is positioned on a circumference which has a diameter larger relative to before the rectifying.

FIG. 5B shows an arrangement of a lead hole 61 formed at the printed circuit board 60. The lead hole 61 is a through hole for inserting the lead pin 53 thereinto.

As shown in FIG. 50, the four lead holes 61 are positioned on a circle 62 shown in a broken line. The diameter of the circle 62 shown in the broken line is a land circle diameter. As the tip of the lead pin 53 before rectifying is located on the circle 63 shown in a dashed line, it is seen that an interval between the lead pins 53 has been spread according to the lead pin rectifying apparatus 100 of the embodiment.

As described above, according to the lead pin rectifying apparatus 100 of the embodiment, the lead pin 53 of the semiconductor laser apparatus 50 may be rectified efficiently.

In the related art method, various problems occur such as producing of fragments and file particles, a decrease in positioning accuracy, degrading of the optical characteristics, contamination of other optical components, occurrence of extra work due to altering, disposing, etc., damaging of the lead pin, etc.

On the other hand, according to the lead pin rectifying apparatus 100 of the embodiment, the lead pin 53 of the semiconductor laser apparatus 50 may be rectified efficiently without the above described problems occurring.

Moreover, only the pressing member 30, the upper side rectifying portion 20, and the lower side rectifying portion 10 that are simple in structure may be used to efficiently rectify the lead pin 53, making it possible to keep manufacturing costs of the lead pin rectifying apparatus 100 low.

Moreover, the shape of the upper side rectifying portion 20 and the lower side rectifying portion 10 determines the shape of the rectified lead pin 53, making it possible to accurately rectify the shape. More particularly, equalization is made possible when there are multiple lead pins 53. As a result, a high picture quality writing image is obtained, making it possible to provide a highly productive image forming apparatus.

Moreover, the lead pin 53 is guided with the grooves 11C and 21D, making it possible to suppress vibration and stress which are produced at the time of rectifying so as to cause no displacement in a bending position.

Moreover, the shape and dimension of the rectified lead pin 53 may be managed with the outer diameter of the head portion 11 and the inner diameter of the cylindrical body 21, making work such as altering after the rectifying unnecessary, and making it possible to provide a highly productive image forming apparatus. More specifically, the outer diameter of the head portion 11 and the inner diameter of the cylindrical body 21 may be set to the land circle diameter to rectify the shape of the lead pin 53 easily and accurately.

Moreover, the o-ring 22 is included at the bottom end of the upper side rectifying portion 20, making it possible to suppress damage of the lead pin 53 (the lead pin 53 being broken and divided) when the upper side rectifying portion 20 is moved down.

Moreover, resin is coated on the surface of the pressing member 30, the upper side rectifying portion 20, and the lower side rectifying portion 10, making it possible to prevent degradation, destruction, etc, due to static electricity. The pressing member 30, the upper side rectifying portion 20, and the lower side rectifying portion 10 are made insulating members due to resin coating.

Moreover, with the lower side rectifying portion 10 and the upper side rectifying portion 20, the multiple lead pins 53 may be simultaneously bent in a one time process, making it possible to rectify to a desired shape in a short time.

While the lower side rectifying portion 10 and the upper side rectifying portion 20 have been described in the above, the lower side rectifying portion 10 may be located on the upper side and the upper side rectifying portion 20 may be located on the lower side.

Moreover, while an embodiment has been described in the above of rectifying the shape of the lead pin 53 by fixing the lower side rectifying portion 10 and moving down the upper side rectifying portion 20, the upper side rectifying portion 20 may be fixed and the lower side rectifying portion 10 may be moved up. Moreover, both the lower side rectifying portion 10 and the upper side rectifying portion 20 may be moved.

Moreover, while an embodiment has been described in the above of the lower side rectifying portion 10 and the upper side rectifying portion 20 respectively having four grooves 11C and 21D, the number of grooves 11C and 21D may be at least one, or may be any number of grooves.

Moreover, the groove 11C and/or the groove 21D do not have to be formed as long as the shape of the lead pin 53 may be rectified.

Furthermore, an embodiment is described of applying resin coating on the surface of the pressing member 30, the upper side rectifying portion 20, and the lower side rectifying portion 10, the resin coating does not necessarily have to be performed. Furthermore, the lower side rectifying portion 10, the upper side rectifying portion 20, and the pressing member 30 may be formed with an insulating material.

Moreover, an embodiment has been described such that an upper face of the head portion 11 of the lower side rectifying portion 10 has a linearly tapered shape, the tapered shape may be a shape which varies exponentially or parabolically. The shape of the head portion 11 of the lower side rectifying portion 10 may be set in alignment with the shape of the desired rectified lead pin 53.

Moreover, while an embodiment has been described of positioning the pressing member 30 and the upper side rectifying portion 20 with the groove 21E and the convex portion 32A, means for positioning the pressing member 30 and the upper side rectifying portion 20 is not limited thereto, so that various other well known means may be used.

Furthermore, while an embodiment has been described above of driving the upper side rectifying portion 20 and the pressing member 30 with the driving apparatus, the lower side rectifying portion 10, the upper side rectifying portion 20, and the pressing member 30 may be driven manually.

Moreover, while an embodiment of rectifying the shape of the lead pin 53 of the semiconductor laser apparatus 50 has been described above, the lead pin rectifying apparatus 100 may be applied to an electronic apparatus other than the semiconductor laser apparatus 50 as long as it is an electronic apparatus having the lead pin 53. For example, it may be an electronic apparatus such as a transistor, or a three-terminal regulator.

In the foregoing, lead pin rectifying apparatuses and lead pin rectifying methods are described according to the exemplary embodiments of the present invention; however, the present invention is not limited to specifically disclosed embodiments, so that modifications and alterations are possible without departing from the claims.

The present application is based on Japanese Priority Application No. 2011-178345 filed on Aug. 17, 2011, the entire contents of which are hereby incorporated by reference.

The invention claimed is:

1. A lead pin rectifying apparatus configured for rectifying lead pins of an electronic component, comprising:
    a first member which includes a tapered upper face and a cylindrically-shaped side face which continues from the upper face, the tapered upper face comprising one or more aligning grooves;
    a cylindrically-shaped second member which has (i) an inner diameter corresponding to an outer diameter of the first member and (ii) one or more guiding grooves formed in an inner wall surface of the cylindrically-shaped second member and in parallel to a central axis of the cylindrically-shaped second member, to permit the lead pins to be positioned between the one or more aligning grooves and the cylindrically-shaped second member; and a pressing member which presses the electronic component towards the first member from the top side of the second member to abut each of the lead pins against an upper face of the first member, wherein after pressing the electronic component to the first member with the pressing member, the second member is pressed to the first member, to rectify the shape of each of the lead pins of the electronic component.

2. The lead pin rectifying apparatus as claimed in claim 1, wherein a number of first guiding grooves are formed on the upper face and the side face of the first member, the location of the first guiding grooves corresponding to the location of the respective lead pins and the number of first guiding grooves being the same as the number of the lead pins.

3. The lead pin rectifying apparatus as claimed in claim 1, wherein a number of second guiding grooves are formed at an inner wall portion of the second member, the location of the second guiding grooves corresponding to the location of the respective lead pins and the number being the same as the number of the lead pins.

4. The lead pin rectifying apparatus as claimed in claim 1, wherein the first member and the second member are insulating members.

5. The lead pin rectifying apparatus as claimed in claim 1, wherein the second member has an elastic member on the end side in a pressing direction to which pressing occurs relative to the first member.

6. The lead pin rectifying apparatus as claimed in claim 5, wherein the elastic member is an insulating member.

7. The lead pin rectifying apparatus as claimed in claim 1, wherein the upper face and the side face of the first member are axially symmetrical with respect to a central axis of the first member.

8. The lead pin rectifying apparatus as claimed in claim 1, wherein the pressing member includes a holding portion which comprises a concave portion that is hollowed out from a bottom face side of the pressing member to accommodate a top portion of the electronic component, a diameter and depth of the concave portion of the holding portion corresponding to a size of the top portion of the electronic component.

9. The lead pin rectifying apparatus as claimed in claim 1, wherein the pressing member is configured to hold the electronic component having the lead pins.

10. The lead pin rectifying apparatus as claimed in claim 1,
wherein convex portions are formed on a surface of a top side of the pressing member, and the second member includes an opening portion at a top part of the second member, and wherein grooves complementary to said convex portions of the pressing member are formed in an inner wall of said opening portion at said top part of the second member, and a number of said grooves in the inner wall of the opening portion at the top part of the second member equals a number of the convex portions of the pressing member.

* * * * *